United States Patent
Lai

(10) Patent No.: US 9,000,571 B2
(45) Date of Patent: Apr. 7, 2015

(54) SURFACE-MOUNTING LIGHT EMITTING DIODE DEVICE AND METHOD FOR MANUFACTURING THE SAME

(75) Inventor: Chih-Chen Lai, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 58 days.

(21) Appl. No.: 13/525,368

(22) Filed: Jun. 18, 2012

(65) Prior Publication Data

US 2013/0168722 A1   Jul. 4, 2013

(30) Foreign Application Priority Data

Dec. 29, 2011   (TW) .................................. 100149674

(51) Int. Cl.
*H01L 23/495* (2006.01)
*H01L 23/02* (2006.01)
*H01L 23/04* (2006.01)
*H01L 23/12* (2006.01)
*H01L 33/48* (2010.01)
*H05K 3/34* (2006.01)
*H01L 23/00* (2006.01)
*H01L 33/62* (2010.01)

(52) U.S. Cl.
CPC .............. *H01L 33/486* (2013.01); *H01L 24/48* (2013.01); *H01L 33/62* (2013.01); *H01L 2224/45099* (2013.01); *H01L 2224/48091* (2013.01); *H01L 2224/48227* (2013.01); *H01L 2924/00* (2013.01); *H01L 2924/00014* (2013.01); *H01L 2924/12041* (2013.01); *H05K 3/3442* (2013.01); *H05K 2201/10106* (2013.01); *H05K 2201/10916* (2013.01); *H05K 2201/2036* (2013.01)

(58) Field of Classification Search
USPC .......... 257/E33.057, E23.061, 678, 676, 673, 257/690, 692, 693, 730–733, 735, 737, 779, 257/786

See application file for complete search history.

(56) References Cited

U.S. PATENT DOCUMENTS

| | | | |
|---|---|---|---|
| 2003/0222335 A1* | 12/2003 | Hirano et al. ................. | 257/678 |
| 2006/0043401 A1* | 3/2006 | Lee et al. ......................... | 257/99 |
| 2007/0252250 A1* | 11/2007 | Hui et al. ....................... | 257/672 |
| 2011/0076805 A1* | 3/2011 | Nondhasitthichai et al. . | 438/123 |
| 2011/0127566 A1* | 6/2011 | Yoon ................................ | 257/99 |
| 2012/0086133 A1* | 4/2012 | Yamaji et al. ................. | 257/782 |
| 2012/0299036 A1* | 11/2012 | Liu et al. ......................... | 257/98 |
| 2013/0049181 A1* | 2/2013 | Wen et al. ...................... | 257/676 |

* cited by examiner

*Primary Examiner* — Yasser A Abdelaziez
*Assistant Examiner* — Cory Eskridge
(74) *Attorney, Agent, or Firm* — Novak Druce Connolly Bove + Quigg LLP

(57) ABSTRACT

An SMT LED device includes an LED and a circuit board carrying the LED. The circuit board has two copper pads thereon, each being provided with a solder on an inner later side thereof which faces the other copper pad. The LED includes two pins and each pin includes a horizontal protrusion and a vertical portion. The LED is mounted on the circuit board between the two copper pads. The solders securely and electrically connect the two pins of the LED with the circuit board.

7 Claims, 2 Drawing Sheets

SURFACE-MOUNTING LIGHT EMITTING DIODE DEVICE AND METHOD FOR MANUFACTURING THE SAME

BACKGROUND

1. Technical Field

The disclosure relates to light emitting devices, and particularly to a surface-mounting light emitting diode (LED) device and a method for manufacturing the LED device, wherein an LED can be more accurately and reliably mounted to a printed circuit board.

2. Description of the Related Art

Light emitting diodes (LEDs) have many advantages, such as high luminosity, low operating voltage, low power consumption, compatibility with integrated circuits, long term reliability, and environmental friendliness which have promoted their wide use as a light source. Now, light emitting diodes are commonly applied in environmental lighting.

A conventional LED device includes a circuit board and at least an LED mounted on the circuit board by surface mounting technology (SMT). A bottom surface of the LED is flat and a plurality of solder points are formed on the bottom surface. When manufacturing the LED device, the LED is arranged on the circuit board which has solder pads applied thereon in advance; the solder points are in contact with the solder pads. Then, the circuit board with the LED arranged thereon is conveyed through an oven, for example, a reflow oven, for a heating process, thereby enabling the solder pads to first melt and then solidify to fix the LED on the circuit board.

However, when disposed on the printed circuit board, the solder points of the LED may be misaligned with the solder pads of the circuit board. When this happens, an insufficient soldering connection between the LED and the circuit board may occur, which may result in a malfunction of the LED device or an unreliable LED device.

Therefore, it is desirable to provide an SMT LED device and a method for manufacturing the SMT LED device which can overcome the described shortcoming.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present SMT LED device and a method for manufacturing the SMT LED device. Moreover, in the drawings, like reference numerals designate corresponding parts throughout the views.

DETAILED DESCRIPTION

Figure 1:
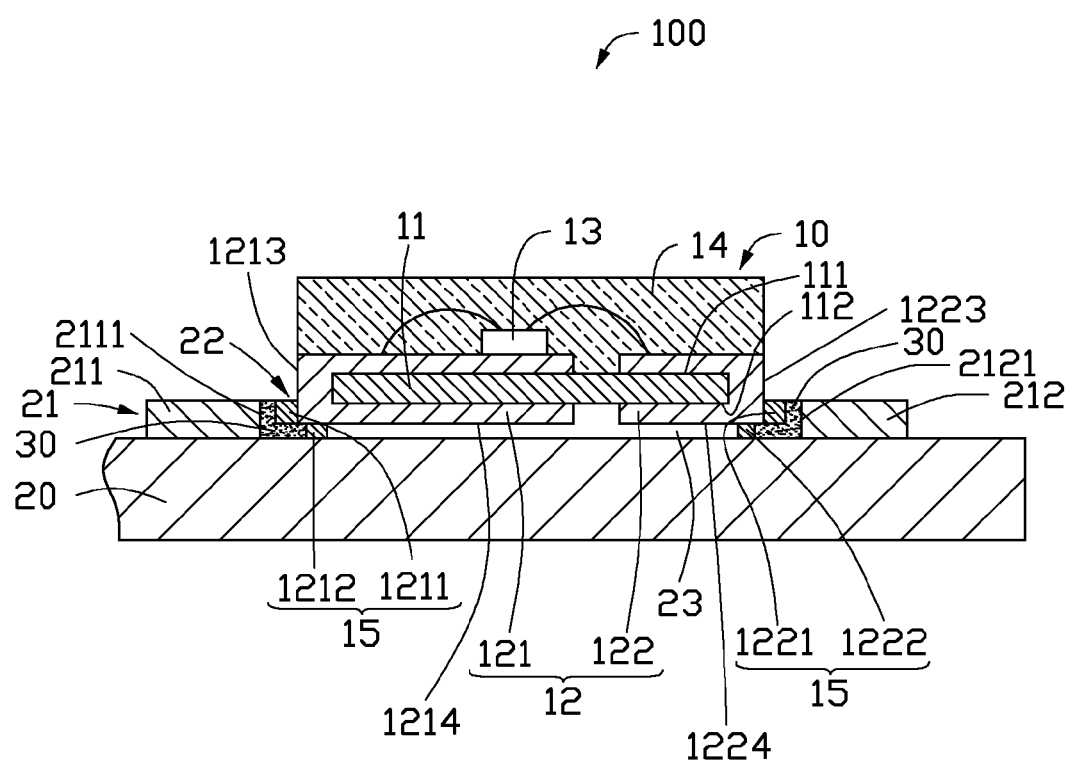
FIG. 1 is a cross-sectional view of an SMT LED device in accordance with an exemplary embodiment of the present disclosure.

Referring to FIG. 1, an LED device 100, in accordance with an exemplary embodiment, includes an LED package 10 and a circuit board 20 on which the LED package 10 is surface mounted.

The LED package 10 includes a substrate 11, a pair of electrodes 12 formed on the substrate 11, an LED die 13 arranged on one of the electrodes 12 over the substrate 11 and electrically connected to the electrodes 12 through wires (not labeled), and an encapsulation 14 enclosing the LED die 13 and the wires therein.

The substrate 11 can be made of materials with excellent thermal conductivity and electrical insulation, such as ceramic. In this embodiment, the substrate 11 is rectangular and thin. The substrate 11 includes a top surface 111 and a bottom surface 112 opposite to the top surface 111. The top surface 111 is used for supporting the LED die 13.

The electrodes 12 include a first electrode 121 and a second electrode 122 spaced from each other. The first and second electrodes 121, 122 are arranged on the substrate 11, extending from the top surface 111 of the substrate 11 to the bottom surface 112 of the substrate 11. The first electrode 121 includes a lateral side 1213 on a lateral side of the substrate 11, and a bottom surface 1214 away from the substrate 11. The second electrode 122 includes a lateral side 1223 on another lateral side of the substrate 11 opposite to the first electrode 121, and a bottom surface 1224 away from the substrate 11. A first horizontal protrusion 1211 and a second horizontal protrusion 1221 extend outward horizontally respectively from the two lateral sides 1213, 1223 of the electrodes 12. Bottom surfaces of the horizontal protrusions 1211, 1221 are coplanar with the bottom surfaces 1214, 1224. A first vertical protrusion 1212 and a second vertical protrusion 1222 extend downwardly vertically respectively from two opposite ends of the bottom surfaces 1214, 1224 of the electrodes 12. The first horizontal protrusion 1211 and the first vertical protrusion 1212 both protrude from the first electrode 11, and the second horizontal protrusion 1212 and the second vertical protrusion 1222 both protrude from the second electrode 12. The four protrusions 1211, 1212, 1221 and 1222 cooperatively form two pins 15 which are used to fix and electrically connect the LED package 10 to the circuit board 20 by soldering. The pins 15 and the electrodes 12 can be formed as a single piece made of metal. In this embodiment, the pins 15 are secured on the electrodes 12 after the electrodes 12 are formed.

The circuit board 20 is used for supporting the LED package 10. The LED package 10 is connected to an external power source by the circuit board 20. The circuit board 20 is a substantially flat plate. A circuit made of copper is arranged on a top surface of the circuit board 20 for providing electrical connection with the LED package 10. The circuit includes a pair of copper pads 21 separated from each other. The two copper pads 21 cooperatively form a space therebetween for receiving a bottom of the LED package 10 therein.

The copper pads 21 include a first pad 211 and a second pad 212. A height of each copper pad 21 is larger than that of each vertical protrusion 1212, 1222. The first and second pads 211, 212 are made of copper foil clad on the top surface of the circuit board 20; the copper foil is processed by etching to form the first and second pads 211, 212. The copper pads 21 are aligned with each other. A solder area 22 is defined between the two copper pads 21 and is exposed for accommodating the LED package 10. The first pad 211 includes a lateral wall 2111 facing the second pad 212, and the second pad 212 includes a lateral wall 2121 facing the first pad 211. A distance between the two lateral walls 2111, 2121 is slightly bigger than a sum of widths of the LED package 10 and the first and second horizontal protrusions 1211, 1212, whereby the solder area 22 can receive the LED package 10 therein.

A solder 30 is coated on each of the two lateral walls 2111, 2121 of the copper pads 21. Each solder 30 has an L-shaped configuration, wherein the two solders 30 are so oriented that they face each other. Each pin 15 has a configuration fitting that of a corresponding solder 30. When the LED package 10 is mounted into the solder area 22, the first horizontal protrusion 1211 is fittingly received in the left solder 30, while the second horizontal protrusion 1221 is fittingly received in the right solder 30. The first vertical protrusion 1212 has a bottom face abutting the circuit board 20 and an outer lateral face abutting against an inner lateral surface of a lower portion of the left solder 30. The second vertical protrusion 1222 has a bottom face abutting the circuit board 20 and an outer lateral face abutting against an inner lateral surface of a lower portion of the right solder 30. Accordingly, the LED package 10 can be precisely and reliably positioned on the circuit board 20 before the soldering of the LED package 10 to the circuit board 20 is proceeded.

Thereafter, the LED device 100 is subject to a heating process to melt the solders 30; when the molten solders 30 are cooled, the solders 30 securely and electrically connect the LED package 10 and the circuit board 20 together to complete the assembly of the LED device 100. In the LED device 100, a space 23 is defined between the bottom surfaces 1214, 1224 of the electrodes 121, 122 and the top surface of the circuit board 20. During the soldering process, since the LED package 10 is positioned between the copper pads 211, an undue lateral movement due to floating of the LED package 10 is blocked by the copper pads 21, whereby the LED package 10 is still precisely positioned at its intended position. Thus, the LED package 10 can be accurately and reliably soldered to the circuit board 20 and have a good electrical connection therewith.

Figure 2:
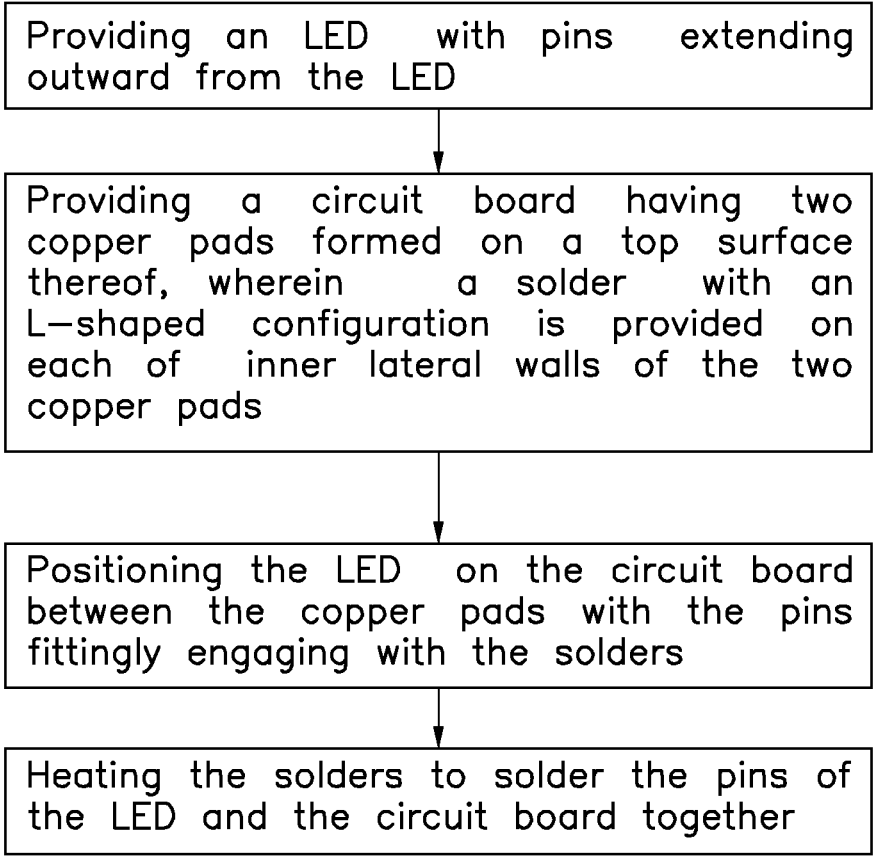
FIG. 2 is a flow chart of a method for manufacturing the SMT LED device of FIG. 1.

FIG. 2 shows the flow chart of a method for manufacturing the LED device 100. The method for manufacturing the LED device 100 includes the following steps.

Firstly, the LED package 10 with pins 15 extending outward from the LED package 10 is provided. The pins 15 each include a vertical protrusion 1212 (1222) and a horizontal protrusion 1211 (1221).

Secondly, the circuit board 20 is provided with a pair of the copper pads 21 formed on the top surface of the circuit board 20. A solder area 22 is defined between the two solder pads 21. A solder 30 is provided on each of lateral walls 2111, 2121 of the two copper pads 21 wherein the solder 30 has an L-shaped configuration.

Thirdly, the LED package 10 is arranged on the circuit board 10 with the vertical protrusions 1212, 1222 positioned on the circuit board 10 and the horizontal protrusions 1211, 1221 fittingly engaging in the solders 30.

Fourthly, the circuit board 20 carrying the LED package 10 is placed in an oven to be subjected to a heating process. Thus, the solders 30 melt in the solder area 22, and then cool down to securely and electrically connect the pins 15 of the LED package 10 to the copper pads 21 of the circuit board 20.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An SMT LED (light emitting diode) device, comprising:
    an LED package comprising two pins each comprising a horizontal protrusion protruding outwardly from a lateral side of the LED package and a vertical protrusion extending downwardly vertically from a bottom surface of the LED package; and
    a circuit board carrying the LED package thereon, the circuit board having two copper pads defining a soldering area therebetween, and a top surface of the circuit board is spaced from the bottom surface of the LED package with the vertical protrusion supported therebetween;
    wherein the LED package is received in the soldering area and each of the two horizontal protrusions of the pins of the LED package is secured and electrically connected to a corresponding copper pad by a solder connecting therewith and an inner lateral side of the corresponding copper pad.

2. The SMT LED device of claim 1, wherein the two copper pads are aligned with each other.

3. The SMT LED device of claim 1, wherein the LED package comprises a substrate, a pair of electrodes being formed on the substrate and extending from a top surface of the substrate to a bottom surface of the substrate, an LED die being arranged over the substrate and electrically connected to the electrodes, each of the horizontal protrusions extending outward horizontally from a lateral side of a corresponding electrode.

4. The SMT LED device of claim 3, wherein each vertical protrusion extends downwardly vertically from a bottom surface of the corresponding electrode, and the vertical protrusion rests on the circuit board.

5. The SMT LED device of claim 4, wherein a height of each vertical protrusion is smaller than that of each copper pad.

6. The SMT LED device of claim 3, wherein a predetermined distance is defined between each of the horizontal protrusions of the LED package and the inner lateral side of the corresponding copper pad which each of the horizontal protrusions faces.

7. The SMT LED device of claim 3, wherein the copper pads are made of copper foil processed by etching of the copper foil.

* * * * *